(12) United States Patent
Rancien et al.

(10) Patent No.: US 7,940,185 B2
(45) Date of Patent: *May 10, 2011

(54) COVER INCORPORATING A RADIOFREQUENCY IDENTIFICATION DEVICE

(75) Inventors: Sandrine Rancien, La Murette (FR); Thierry Mayade, Saint-Beron (FR)

(73) Assignee: Arjowiggins Security SAS, Paris (FR)

( * ) Notice: Subject to any disclaimer, the term of this patent is extended or adjusted under 35 U.S.C. 154(b) by 0 days.

This patent is subject to a terminal disclaimer.

(21) Appl. No.: 12/805,166

(22) Filed: Jul. 15, 2010

(65) Prior Publication Data

US 2010/0282855 A1 Nov. 11, 2010

Related U.S. Application Data

(63) Continuation of application No. 10/312,009, filed as application No. PCT/FR02/01423 on Apr. 25, 2002, now Pat. No. 7,847,698.

(30) Foreign Application Priority Data

Apr. 26, 2001 (FR) ..................................... 01 05616

(51) Int. Cl.
*G08B 13/14* (2006.01)
(52) U.S. Cl. ............... 340/572.8; 340/572.1; 340/572.3; 340/572.7; 340/10.1; 340/693.9
(58) Field of Classification Search ............... 340/572.8, 340/572.1, 572.7, 505, 10.1, 693.9, 825.69; 281/15.1, 29
See application file for complete search history.

(56) References Cited

U.S. PATENT DOCUMENTS

| | | | |
|---|---|---|---|
| 3,922,424 A | 11/1975 | Andersen | |
| 3,972,764 A * | 8/1976 | Sendor | 156/243 |
| 4,474,292 A | 10/1984 | Haghiri-Tehrani et al. | |
| 4,990,891 A | 2/1991 | Reeb | |
| 5,528,222 A | 6/1996 | Moskowitz et al. | |
| 5,690,787 A | 11/1997 | Hultman et al. | |
| 5,741,392 A | 4/1998 | Droz | |
| 5,786,626 A | 7/1998 | Brady et al. | |
| 5,847,649 A | 12/1998 | Collins et al. | |
| 5,880,934 A | 3/1999 | Haghiri-Tehrani | |
| 5,895,557 A | 4/1999 | Kronzer | |

(Continued)

FOREIGN PATENT DOCUMENTS

DE 196 01 358 A1 7/1996

(Continued)

OTHER PUBLICATIONS

UK Passport of T E Berridge issued May 10, 1985.

(Continued)

Primary Examiner — Davetta W Goins
(74) Attorney, Agent, or Firm — Oliff & Berridge, PLC

(57) ABSTRACT

The invention relates to a multilayer structure such as a cover paper for a booklet, in particular a passport. The structure includes a radiofrequency identification device having a chip which is received in the thickness of the multilayer structure without generating extra thickness, the materials constituting the various layers of the multilayer structure are selected, as are the thicknesses of said layers, in such a manner that the cover withstands mechanical and thermal shocks, and in particular is capable of being subjected to graining treatment, and/or to decoration treatment by depositing a film by hot transfer under pressure, and/or to lamination treatment while depositing security films.

24 Claims, 2 Drawing Sheets

U.S. PATENT DOCUMENTS

| | | | |
|---|---|---|---|
| 5,902,437 A * | 5/1999 | McDonough et al. | 156/234 |
| 5,914,657 A | 6/1999 | Chen | |
| 6,064,855 A | 5/2000 | Ho | |
| 6,094,137 A | 7/2000 | Rasch et al. | |
| 6,100,804 A | 8/2000 | Brady et al. | |
| 6,111,506 A | 8/2000 | Yap et al. | |
| 6,254,953 B1 | 7/2001 | Elston | |
| 6,255,949 B1 | 7/2001 | Nicholson et al. | |
| 6,281,795 B1 | 8/2001 | Smith et al. | |
| 6,608,911 B2 | 8/2003 | Lofgren et al. | |
| 6,639,514 B1 | 10/2003 | Muller | |
| 6,726,109 B2 * | 4/2004 | Yamagishi et al. | 235/492 |
| 6,830,192 B1 | 12/2004 | Krul et al. | |
| 7,006,116 B1 | 2/2006 | Meyers et al. | |
| 2002/0056855 A1 | 5/2002 | Riner | |

FOREIGN PATENT DOCUMENTS

| | | |
|---|---|---|
| DE | 196 54 902 A1 | 10/1997 |
| EP | 0 019 191 A1 | 11/1890 |
| EP | 0 070 784 | 1/1983 |
| EP | 0 595 549 B1 | 9/1997 |
| EP | 0 632 767 B1 | 8/1998 |
| EP | 0 905 657 A1 | 3/1999 |
| EP | 1 008 459 A1 | 6/2000 |
| EP | 1 130 542 A1 | 9/2001 |
| EP | 1 023 501 B1 | 11/2002 |
| EP | 1 060 457 B1 | 11/2002 |
| GB | 2 248 492 A | 1/1992 |
| JP | A-11-348469 | 12/1999 |
| JP | A-11-348470 | 12/1999 |
| JP | A-11-348471 | 12/1999 |
| JP | A-2001-092934 | 4/2001 |
| UA | 56835 | 7/2003 |
| UA | 58632 | 8/2003 |
| WO | WO 93/19942 | 10/1993 |
| WO | WO 98/02848 | 1/1998 |
| WO | WO 99/44172 | 9/1999 |
| WO | WO 00/26855 | 5/2000 |
| WO | WO 00/26856 A2 | 5/2000 |
| WO | WO 00/42569 A1 | 7/2000 |
| WO | WO 01/09262 A1 | 2/2001 |
| WO | WO 01/20564 A1 | 3/2001 |

OTHER PUBLICATIONS

French Search Report with English-Language Translation, dated Dec. 7, 2009.

Office Action dated Jun. 30, 2005 from parent U.S. Appl. No. 10/312,009.

Office Action dated Jan. 10, 2006 from parent U.S. Appl. No. 10/312,009.

Office Action from parent U.S. Appl. No. 10/312,009, dated Jul. 27, 2006.

* cited by examiner

COVER INCORPORATING A RADIOFREQUENCY IDENTIFICATION DEVICE

This is a Continuation of application Ser. No. 10/312,009 filed Mar. 10, 2003, which is a National Phase of Application No. PCT/FR02/01423, filed Apr. 25, 2002. The disclosure of the prior applications is hereby incorporated by reference herein in its entirety.

The present invention relates to multilayer structures such as covers for booklets, and it also relates to methods of manufacturing them.

BACKGROUND

The cover papers of booklets issued by authorities are subjected to a very wide variety of mechanical and thermal shocks, both during manufacture and in use. These cover papers are usually subjected to a graining operation to give them an attractive surface appearance. During the graining operation, the cover is passed between two embossing rollers where it is subjected to relatively high pressure, of about 100 bars ($10^7$ Pascals (Pa)).

In addition, such booklet cover papers are also subjected in some cases to a decoration operation in which a metallized or holographic piece of foil is applied under pressure by a hot-transfer operation. During this operation of depositing the foil, the cover passes through a press where it is subjected to relatively great pressure at relatively high temperature.

In addition, in the particular case of a passport, the booklet comprises a set of sheets or a "signature" including an end paper which is laminated to the inside face of the front flap of the cover, and a transparent film is transferred hot onto one of the inside pages or the end paper in order to protect the variable mentions that have previously been entered thereon. During the transfer operation, the passport is inserted into a laminator between two hot rolls, and the cover is again subject to non-negligible pressure. The temperature to which the cover is exposed may reach 130° C. for a period of several seconds.

Naturally, the passport must also present a lifetime of several years, in particular of ten years in Europe, and it must possess sufficient qualities of withstanding handling.

To satisfy the above-mentioned constraints, certain covers for passports are presently manufactured by impregnating a 200 micrometer (μm) thick cellulose medium with a polymer until it is saturated, and then using a scraper blade to spread a 50 μm thick covering layer on one of its faces, which covering layer is based on polymers and dyes, possibly including expanded microbeads. A varnish can then be applied to the deposited layer, in particular to make the cover glossy and to impart a degree of resistance to scratching or abrasion.

Attempts have also been made to increase the security of passports, in particular by providing them with respective radiofrequency identification devices (RFIDs) as described in U.S. Pat. No. 5,528,222. That patent describes a laminate which includes a chip and an antenna, the laminate subsequently being inserted in the front flap of the passport cover, for example. Nevertheless, that patent does not address itself in detail to the manner in which the radiofrequency identification device is finally integrated in the passport. A first drawback of such a cover with a radiofrequency identification device lies in the lack of uniformity between the thickness of the front flap and the thickness of the back flap of the passport. A second drawback comes from the fact that inserting a laminate into the passport involves an additional transformation operation on the passport assembly machine.

International patent application WO 00/26856 also mentions the possibility of providing a passport with an RFID. The chip is put into place in an opening in a polyimide or polyester film, and it is held in the opening by means of a resin.

The Malaysian passport presently in circulation is provided with a radio-frequency identification device. That identification device is inserted in the back flap of the passport during assembly, between the grained cover paper and the end paper of the set of inside pages. That radiofrequency identification device is in the form of a three-layer complex comprising a chip connected to an antenna, both being supported by a polyester film, which is itself inserted between two other polymer films for protecting the chip and the antenna. That laminate presents extra thickness over the chip. Inserting that laminate into the back flap of the passport gives rise to two types of extra thickness: there is a thickness difference of 1650 μm between the front flap and the back flap of the passport, and there is a thickness difference of 650 μm in the back flap between the zone where the chip is to be found and the zone where the antenna is to be found. The appearance of such a passport draws the attention of potential counterfeiters on the presence of the RFID device.

Finally, there exists demonstration passports in which the radiofrequency identification device is constituted merely by a tag (a polyester medium having the chip and the antenna present thereon) such as the device sold under the trademark Tag-it® by the supplier Texas Instruments, for example, which device is inserted between the grained cover paper and the end paper of the booklet that is laminated to the cover. The chip gives rise to local extra thickness of more than 200 μm and its presence can be perceived. In addition, it remains exposed to the shocks and stresses to which the passport is subjected, in particular during hot transfer of the transparent film.

International patent application WO 00/42569 discloses a label incorporating a radiofrequency identification device. That label has a layer of adhesive and a covering layer with the radiofrequency identification device chip being received therein. The chip is connected to a printed antenna. Such a label does not present extra thickness over the chip, but nevertheless it is not suitable for constituting a security device that is satisfactory for a passport since the presence of the label on one of the flaps of the passport cover would give rise to a difference of thickness between the two flaps. The appearance of such a passport would likewise draw the attention of potential counterfeiters to the presence of the RFID device.

SUMMARY

The invention seeks to mitigate the drawbacks of the prior art, in particular to provide a booklet cover paper that includes a radiofrequency identification device that does not present any local extra thickness, and to provide a booklet cover paper including a radio-frequency identification device ready for mounting in a passport without requiring any additional transformation operation.

There also exists a need for booklets, in particular passports, which are attractive in appearance and in which the radiofrequency identification device is sufficiently well protected to guarantee the necessary reliability during the entire duration of the validity of the booklet, i.e. several years for a passport.

The present invention provides a multilayer structure such as a cover paper for a booklet, in particular a passport, the structure including a radiofrequency identification device having a chip, the chip being received in the thickness of the multilayer structure without leading to extra thickness, and the materials constituting the various layers of the multilayer structure being selected, as are the thicknesses of said layers, in such a manner that the cover withstands mechanical and thermal shocks. In particular, the cover paper must be suitable for being subjected to treatments of graining and/or decoration by having a film or foil deposited thereon by hot transfer under pressure and/or by rolling while depositing transparent security films on pages carrying the variable mentions of the passport.

The invention makes it possible to obtain a booklet, in particular a passport, having a cover of attractive appearance that does not draw the attention of potential counterfeiters to the radiofrequency identification device since it does not present any localized extra thickness and, where appropriate, since it presents a grained appearance.

In addition, because of the absence of any localized extra thickness and because of the way the radiofrequency identification device is protected, the cover paper of the invention may be used during manufacture of a passport in the same manner as a conventional cover paper that does not incorporate a radiofrequency identification device, and this is most advantageous, in particular for issuing authorities.

In a particular embodiment, the chip of the radiofrequency identification device is situated close to the spine fold in the booklet cover so as to lie in a zone that is less exposed to stresses since it is stiffened to some extent by the fold.

The multilayer structure may include at least one sheet having a fiber base comprising a greater or lesser quantity of natural and/or synthetic fibers, in particular cellulose fibers. The fiber base may contain a polymer material selected in such a manner as to confer on the multilayer structure firstly properties of withstanding tearing so as to withstand subsequent conditions of use, and secondly properties of toughness that are sufficient to protect the radiofrequency identification device from mechanical shocks. The material may be selected, for example, from the following list: natural or synthetic rubbers; styrene butadiene rubber; polybutadiene; butadiene and acrylonitrile copolymers; acrylic polymers; polychloroprene; and mixtures thereof.

In a particular embodiment, the chip of the radiofrequency identification device is housed in a layer of the multilayer structure which presents thickness that is greater than or equal to the thickness of the chip and toughness enabling it in the event of compression being applied for a short while to conserve thickness that is greater than or equal to the thickness of the chip so as to ensure that it is protected. This layer may comprise a fiber base comprising a greater or smaller quantity of natural and/or synthetic fibers, in particular cellulose fibers, said base itself including a polymer material selected so as to confer on the multilayer structure properties of sufficient toughness to protect the radio-frequency identification device from mechanical shocks. The layer may also be a material based on polymer alone, for example a coating based on polyvinyl chloride (PVC), possibly plasticized, optionally including swelling or foaming agents.

The multilayer structure may include a layer of polymer-based material suitable for graining. The polymer may be selected from the following list: polymers based on PVC, optionally plasticized, polyurethanes, and natural or synthetic elastomers, optionally including swelling agents, PVC emulsions, and butadiene/acrylonitrile copolymer or butadiene/acrylonitrile/styrene copolymer, and mixtures thereof.

The invention also provides a passport whose cover is constituted by a multilayer structure as defined above.

The invention also provides various methods of manufacturing a cover as defined above.

In particular, the invention provides a method comprising the following steps:
depositing the radiofrequency identification device on a first sheet; and
assembling said first sheet on a second sheet in such a manner as to obtain a resultant thickness that is substantially constant, the second sheet being sufficiently compressible at the time of assembly to receive the chip in its thickness.

The invention also provides a method comprising the following steps:
placing the radiofrequency identification device (chip and antenna) on a first sheet; and
laminating said first sheet with a second sheet, the chip of the radiofrequency identification device being situated on the inside of the first sheet, a hole or cavity being formed in the other sheet, said hole or cavity being of a shape that is suitable for receiving the chip, the chip being put into place in said hole or cavity while said sheets are being laminated together.

For example, it is possible to make the second sheet with a hollow watermark of depth greater than the thickness of the chip, to place the chip on the first sheet, and to laminate the second sheet onto the first sheet in such a manner that the chip is received in the watermark. The first sheet may also include a cavity in which the chip is received in part.

The invention also provides a method comprising the following steps:
placing the radiofrequency identification device (chip and antenna) on a first sheet;
making a second sheet with a hole of a shape suitable for containing the chip;
making a third sheet; and
laminating together the three sheets so that the second sheet is sandwiched between the first sheet and the third sheet and so that the chip is received in the hole in the second sheet.

The invention also provides a method comprising the following steps:
making a first sheet;
making a coating on said first sheet with a cavity of a shape suitable for containing the chip;
placing the RFID on said sheet so that the chip is received in the previously-made cavity; and
coating the sheet on the side carrying the RFID so as to protect the device.

The invention also provides a method comprising the following steps:
placing the radiofrequency identification device (chip and antenna) on a first sheet; and
placing a coating on said first sheet to a thickness that is greater than the thickness of the chip.

For example, the radiofrequency identification device may be placed on a face of the sheet, and then said face of the sheet can be coated in a mixture based on a non-gelled liquid resin, with the thickness of the deposit, once dry, being greater than the thickness of the chip. The deposited coating layer may be grained once dry.

It is also possible to place a resin on the face of the sheet carrying the radio-frequency identification device, which resin may be based on a hot-melt component, with the deposited thickness being greater than the thickness of the chip. The coating may be marked while hot so as to create graining immediately prior to final drying.

In the examples of methods given above, the first sheet may comprise a fiber base, in particular a paper base, and said fiber base may be saturated with a material, in particular a polymer, e.g. a latex elastomer, providing it with resistance to tearing and subsequently providing the radiofrequency identification device with protection. This first sheet may also be coated in a polymer-based mixture suitable for graining. The polymer-based mixture suitable for graining may, in a variant, be deposited in a coating operation after the first and second sheets have been assembled together. The second sheet may be impregnated with a thermoplastic polymer.

In another method, it is also possible to make the first sheet from a fiber base, preferably saturated in latex, to emboss said first sheet so as to create a cavity having a shape that matches that of the chip, to make the second sheet from a fiber base, preferably saturated with synthetic or natural resins by impregnation or by bulk precipitation, to deposit a chip and an antenna on said second sheet, and to laminate said second sheet with the first sheet so that the chip is received in the cavity made by embossing.

In an implementation of the invention, the chip and the antenna may be fixed on a support film, e.g. a polyester film, prior to being associated with the fiber base.

When the antenna of the RFID is made using conductive ink, the ink may include one or more tamperproofing agents, naturally providing they are compatible with the ink used.

BRIEF DESCRIPTION OF THE DRAWINGS

Other characteristics and advantages of the present invention appear on reading the following detailed description of non-limiting embodiments, and on examining the accompanying drawings, in which.

DETAILED DESCRIPTION OF EMBODIMENTS

Figure 1:
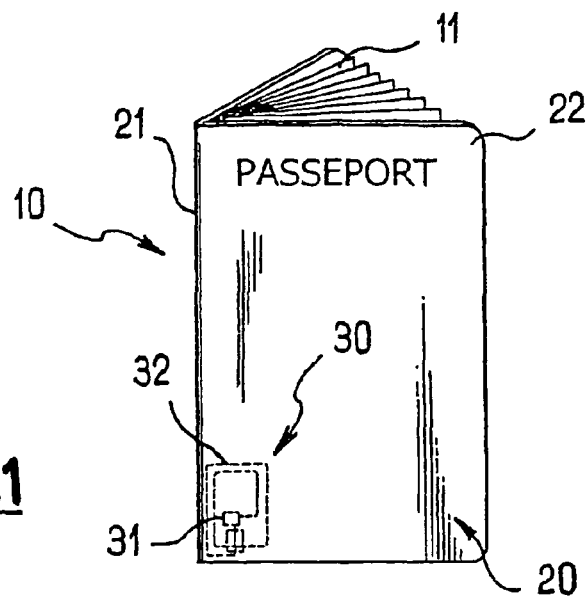
FIG. 1 is a diagrammatic perspective view of a passport in accordance with the invention.
Figure 2:
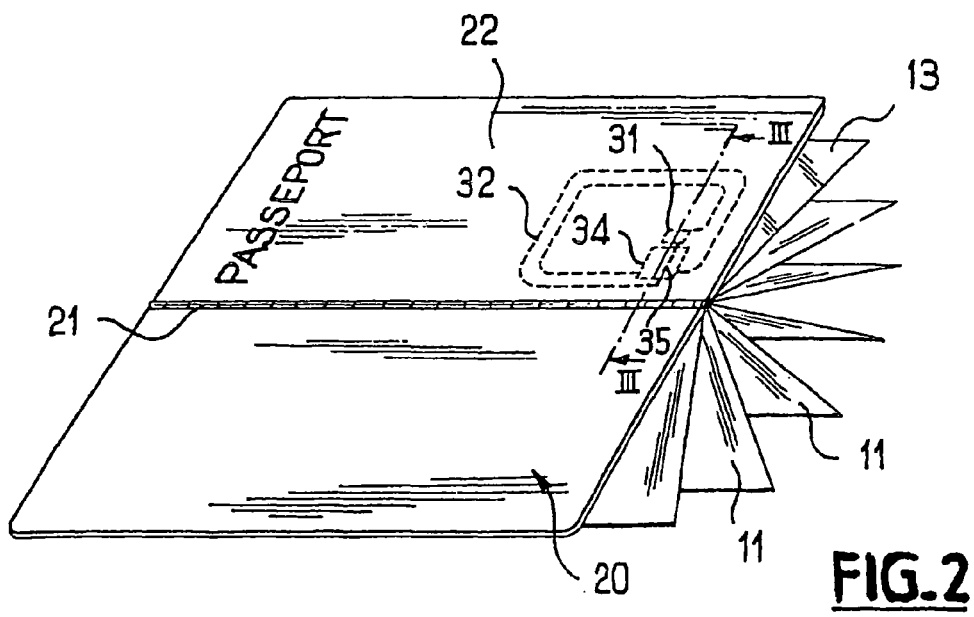
FIG. 2 shows the FIG. 1 passport with its cover opened out flat.
Figure 3:
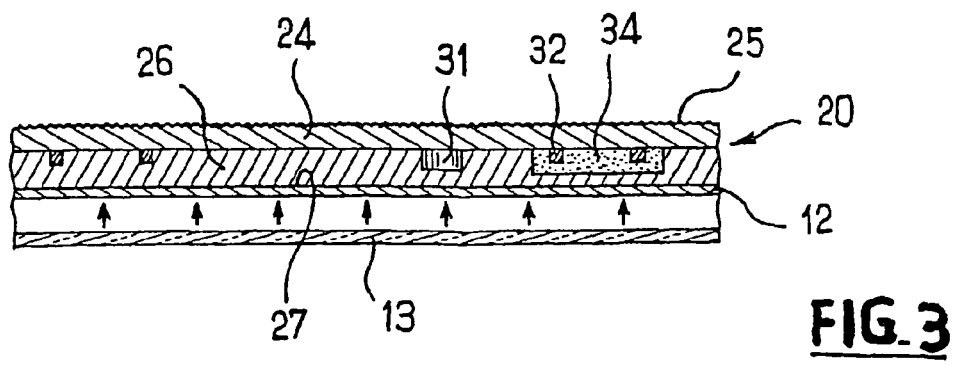
FIG. 3 is a fragmentary and diagrammatic section on III-III of FIG. 2.

FIGS. 1 to 3 show a passport 10 whose cover 20 is provided with a radio-frequency identification device 30 comprising a chip 31 and an antenna 32. Numerous manufacturers presently provide radiofrequency identification devices that are suitable, such that the chip 31 and the antenna 32 are not described in detail in order to simplify the present description. Manufacturers of suitable chips include in particular the suppliers Inside Technologies, Texas Instruments, or Polymer Flip Chip Corporation, this list not being limiting.

In an embodiment that is not shown, the chip includes its own antenna. This makes the radiofrequency identification device simpler to incorporate in the cover of the passport but suffers from the drawback of reducing the range of the radio link that can be established with a reader and/or writer device.

As can be seen in FIGS. 1 and 2, the chip 31 is preferably situated close to the fold 21 of the cover 20, for example in a zone corresponding to one-fourth of the width of the front or rear flaps 22 or 24 of the cover, as measured from the fold 21.

The passport 10 comprises a set of sheets 11 having an end paper 12 stuck to the back of the front flap 22 of the cover. This end paper 12 is the sheet on which variable mentions are printed, after which it is covered in a transparent adhesive film or foil 13 which is applied by hot transfer.

In the example of FIGS. 1 to 3, the cover 20 has a support layer 24 with one face covered in a layer 25 of material suitable for being grained, and the outside surface of the cover 20 presents graining.

The other face of the support layer 24 carries the chip 31 and its antenna 32 and it is covered in a second layer 26 with the chip 31 being received in the thickness thereof. The face 27 of the layer 26, opposite from the layer 24, constitutes the inside surface of the cover 20.

When the antenna 32 is made by selective printing using a conductive ink on the layer 24, and when it presents several turns, it may be necessary locally to deposit insulation 34 on a fraction of the turns in order to be able to implement an electrical connection bridge 35 on said insulation, likewise by selectively depositing a conductive ink, in order to connect one of the ends of the turns to the chip 31. By way of example, the insulation 34 may itself be deposited by selective printing. The chip 31 may be connected to the antenna 32 using methods that are well known, in particular by means of a conductive adhesive, or indeed by thermal compression or by soldering.

The thickness of the layer 26 is greater than the thickness of the chip 31 so that the chip is protected from shocks both by the layer 26 and by the layer 24.

The thickness of the layer 26 is sufficient in the example described to ensure that in the event of the cover being compressed during the processing involved in decorating and making up the passport, the layer 26 conserves thickness that is greater than that of the chip 31. Thus, given the materials used for making the layers 24 and 26, and the thicknesses thereof, the cover is capable of being subjected to conventional treatments of graining and hot transfer of the film 13 onto the end paper 12.

In general manner, the cover 20 may be made in numerous ways, and the layers 24 and 26 may present different structures, in particular they may optionally include a fiber base. Thus, the multilayer structure shown in FIG. 3 is not in any way limiting on the invention.

Various examples of manufacturing the cover are described below.

EXAMPLE 1

The method begins by making a first sheet having a paper base (cellulose fibers optionally with synthetic fibers), which is saturated in a styrene-butadiene copolymer latex so as to provide it with resistance to tearing and so as to provide subsequent protection to the radiofrequency identification device.

Thereafter, after said first sheet has dried, the chip and the antenna of the radiofrequency identification device are deposited thereon by a conventional method. In particular, the antenna may be made by silkscreen printing using a conductive ink, and subsequently electrical connections can be established with the chip by thermal compression. Where appropriate, insulation is deposited on part of the turns and an electrical connection bridge is made on said insulation between one of the ends of the turns and the chip.

At this stage in manufacture, one of the faces of the first sheet carries extra thickness in the region of the antenna of about 30 μm and in the region of the chip of about 200 μm. The thickness of the first sheet itself may be about 200 μm, for example.

Figure 4:
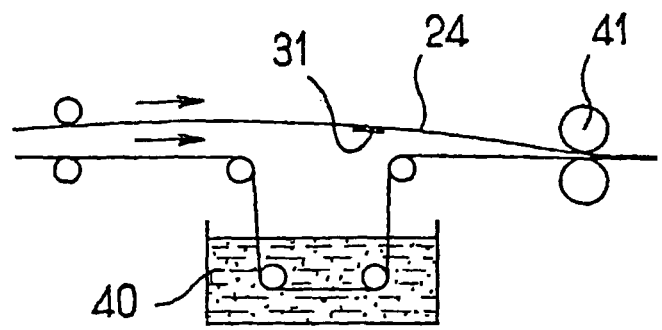
FIG. 4 shows a first implementation of a method of manufacturing the cover.

FIG. 4 shows, diagrammatically, the first sheet as formed in this way with the chip 31 fixed thereon.

Simultaneously, paper of the blotting type is impregnated with a polymer-based mixture (e.g. styrene-butadiene), said paper being thicker than the chip, and being impregnated by being passed through an impregnating bath 40 so as to form a second sheet. By way of example, the thickness of the second sheet may be about 300 μm.

Thereafter, the wet, polymer-saturated blotting type paper is caused to pass together with the previously-prepared first sheet between two rolls 41, with the radio-frequency identification device being on the inside face of the first sheet.

During the wringing operation, the two sheets bind together via the polymer-based mixture with which the blotting type paper is impregnated, and this paper fits closely over the relief constituted by the chip due to its compressibility when in the wet state. Thus, at the location of the chip, and under the effect of the pressure applied by the rolls 41, the impregnation material is expelled and the chip penetrates into the blotting type paper.

Thereafter, one face of the laminate formed in this way, e.g. the outside face of the first sheet, is coated with a mixture of polymers so as to make it suitable for graining. The thickness of the deposited coating layer may be 50 μm, for example.

A printing varnish (mat or gloss) may be applied to the layer deposited in this way in order to improve the surface appearance and the ability to withstand handling.

EXAMPLE 2

In this second example, a first sheet is made that is identical to that of the preceding example, carrying the radiofrequency identification device.

Figure 5:
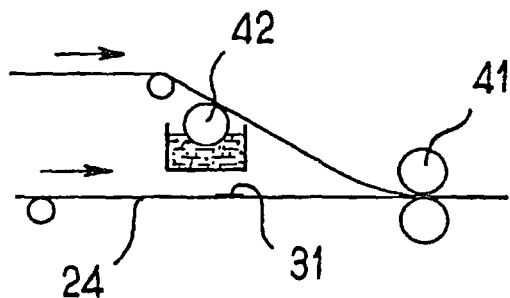
FIG. 5 shows a second implementation of the method of manufacturing the cover.

Blotting type paper of thickness greater than that of the chip, e.g. 300 μm thick, is brought into contact with a gumming machine 42 where one of its faces is impregnated with a polymer such as vinyl polyacetate, and this coated face is then brought into contact with the first sheet between two rolls 41, as shown in FIG. 5.

The polymer-saturated blotting type paper and the previously-prepared first sheet carrying the radiofrequency identification device on its inside face are bonded together with the blotting type paper matching the shape in relief of the chip because of its compressibility when in the wet state.

Thereafter, the resulting laminate is coated on one of its faces that is to constitute the outside face of the cover in a polymer mixture that is suitable for graining. The thickness deposited by coating, e.g. on the outside face of the first sheet, may be about 50 μm.

As in the preceding example, a (mat or gloss) printing varnish may be deposited so as to improve the surface appearance and its ability to withstand handling.

EXAMPLE 3

A first sheet is made identical to that of the preceding examples, carrying the radio-frequency identification device.

Figure 6:
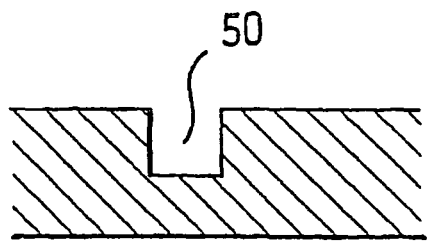
FIG. 6 is a fragmentary and diagrammatic section showing a cavity formed in one of the sheets of the passport cover.
Figure 7:
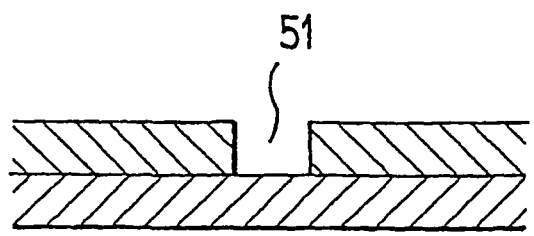
FIG. 7 is a fragmentary and diagrammatic section of a cavity made by impression.

A second sheet 53 is made on a paper base, shown diagrammatically in FIG. 6, said sheet having a hollow watermark 50 of the same shape as the chip 31. The depth of the watermark 50 is slightly greater than the thickness of the chip 31. The thickness of the paper is about 300 μm, for example. The sheet 53 is preferably saturated in polymer in order to provide subsequent protection for the chip.

After identifying the locations of the chip 31 and of the watermark 50, the sheet 53 is laminated with the previously-prepared first sheet in such a manner that the chip 31 is received in the watermark 50. Lamination may be performed cold or hot. Since the sheet 53 is still wet, the laminate made in this way is passed between two rolls and then dried.

The face of the laminate that is to constitute the outside surface of the passport can then be coated in a polymer mixture that is suitable for graining, and a (gloss or mat) printing varnish may be deposited on the coating in order to improve its surface appearance and its ability to withstand handling.

EXAMPLE 4

A first sheet is made identical to that of the preceding examples, carrying the radiofrequency identification device.

A second sheet is made with a hole made by laser etching or mechanically using a punch, said hole being of a shape that corresponds to the shape of the chip and the paper being of a thickness that is not less than the thickness of the chip. The second sheet may possibly be saturated in polymer(s) in order to provide subsequent protection for the chip. By way of example, the thickness of the second sheet may be about 200 μm.

A third sheet is also made on a paper base, and it is preferably saturated with one or more synthetic or natural resins, e.g. elastomer latexes, by impregnation or by bulk precipitation, with the impregnation material being selected in such a manner as to subsequently provide protection for the radiofrequency identification device. By way of example, this third sheet has a thickness of about 100 μm.

Thereafter the three sheets are laminated together in matching positions so that the second sheet is applied to the first sheet carrying the chip in such a manner that the chip is received in the hole. The third sheet covers the second sheet on its side opposite from the first sheet.

The outside face of the first sheet is then coated in a polymer mixture that is suitable for graining.

A (gloss or mat) printing varnish may optionally be deposited on said coating in order to improve its surface appearance and its ability to withstand handling.

EXAMPLE 5

A first sheet is made identical to that of the preceding examples, carrying the radiofrequency identification device.

Thereafter, a spreader-blade is used to coat the face of said first sheet that carries the chip with a "plastisol" type mixture based on PVC having a plasticizer and a swelling agent incorporated therein. The assembly is gelled in a tunnel oven at a temperature of about 200° C. The quantities of plasticizer and swelling agent are adjusted so that the coating, once gelled and cooled, presents compressibility such that the thickness of the layer while being compressed or after being compressed remains greater than the thickness of the chip in order to protect said chip. For example, a thickness of about 300 μm is deposited. The coated layer may be grained after drying. After gelling and cooling, this layer provides the looked-for mechanical characteristics.

A (gloss or mat) printing varnish may be deposited on the coating in order to improve its surface appearance and its ability to withstand handling.

EXAMPLE 6

A sheet identical to the first sheet of the preceding examples is made, carrying the radiofrequency identification device.

Thereafter, the face of said sheet carrying the radiofrequency identification device is coated with a mixture based on a hot-melt resin, comprising a powder that melts on heating, for example polyurethane, with deposition being performed by means of a suitable extrusion system.

The polymer used for the coating is selected in such a manner as to present compressibility such that the thickness of the deposited coating layer, while being compressed or after being compressed in a shock, remains greater that the thickness of the chip in order to protect the chip. By way of example, the deposited thickness may be about 300 μm.

The resulting coating may be marked while hot so as to create the desired graining.

Thereafter, a (gloss or mat) printing varnish may be deposited on the deposited coating layer, possibly already grained, in order to improve its surface appearance and its ability to withstand handling.

EXAMPLE 7

A first sheet is made using a paper base (cellulose fibers with or without synthetic fibers), optionally saturated in latex, and a first face of said paper base is coated with a mixture based on polymers suitable for being grained, and a (gloss or mat) coating varnish is optionally deposited on the coating. The thickness of the paper base is about 200 μm, for example, and the thickness of the layer that is suitable for graining is about 50 μm.

Thereafter, a cavity of depth not less than that of the chip and of a shape matching the shape of the chip is formed in the second face of the paper base by mechanical embossing.

The first face may optionally be grained simultaneously.

A second sheet is also made on a paper base which is preferably saturated with synthetic or natural resins, e.g. elastomer latexes, by impregnation or bulk precipitation, for the purposes of strengthening its cohesion and subsequently of protecting the radio-frequency identification device. The thickness of this second sheet is 200 μm, for example.

A chip and an antenna is placed on said second sheet using a conventional method.

Thereafter, the second sheet carrying the chip of the antenna is laminated with the first sheet in such a manner that the chip is received in the cavity made by embossing.

After lamination, the resulting laminate is dried.

EXAMPLE 8

A first sheet is made as in Example 7.

Thereafter, a cavity of depth substantially equal to half the thickness of the chip is made in said sheet, by mechanical embossing.

A second sheet is made as in Example 3, with a watermark of thickness substantially equal to half the thickness of the chip provided with its antenna, e.g. a chip of the IC-Link® type from the supplier Inside Technologies.

Thereafter the two sheets are assembled together with the chip being fully received in the facing cavities of the two sheets.

EXAMPLE 9

A first sheet is made identical to that of the preceding example.

Thereafter, the face of said first sheet opposite its face carrying the coating is provided with a radiofrequency identification device.

To do this, it is possible to begin by depositing a conductive ink, e.g. by silkscreen printing, in selective manner so as to form two connection zones for the chip and an electrical link bridge making it possible subsequently to connect one end of the antenna to one of said connection zones.

Thereafter, an insulating ink is deposited, e.g. by silkscreen printing, in selected manner so as to form a hidden region over the connection zone and over the end of the link bridge opposite from the corresponding connection zone.

The turns of the antenna are made by depositing the conductive ink, e.g. by silkscreen printing. The ink used may contain tamperproofing agents. The antenna is electrically connected via one of its ends to one of the above-mentioned connection zones, and via its other end to the free end of the electrical connection bridge.

An insulating layer is deposited, e.g. by silkscreen printing, in selective manner as to form a hidden region of thickness that is at least equivalent to that of the chip so as to be capable of receiving the chip within the final structure without creating any extra thickness. The thickness of the deposited insulating layer is abut 300 μm, for example. The insulation may be deposited in one or more passes and it may include a swelling agent.

After the chip has been put into place, an optional protective layer may be deposited on the insulating layer.

EXAMPLE 10

The method begins by making a first sheet identical to that of the preceding example.

Thereafter, conductive ink is deposited, e.g. by silkscreen printing, on the face of said first sheet opposite from its face that has been coated in a mixture that is suitable for graining, the ink serving to form the turns of the antenna.

After that, an insulating ink 34 is deposited in selective manner and an electrical link bridge 35 is made between one end of the turns and a connection zone for the chip. An insulating layer is then deposited, e.g. by silkscreen printing, in selected manner so as to form a hidden layer of thickness that is at least equivalent to that of the chip.

Once the chip has been put into place in the cavity formed in the insulating layer, it can be covered in an optional protective layer.

EXAMPLE 11

The method proceeds as in Example 1, except that the chip and the antenna are carried by a thin flexible support such as synthetic film, e.g. made of polyester.

The support film carrying the chip and the antenna is then associated with a sheet of the blotting paper type.

In Examples 1 to 6, the first sheet may be made, in a variant, to carry from the beginning coating that is suitable for graining and/or may receive from the beginning a printing varnish.

In general manner, the material saturating the paper base of the first sheet in Examples 1 to 10, or the second sheet in Examples 1 to 4 may be a synthetic or natural resin, e.g. an elastomer or a mixture of resins, said material being selected so as to provide flexibility, so as to improve resistance to tearing, resistance to deformation during compression, and toughness. It is possible to use in particular a polymer of the elastomer type, styrene butadiene copolymers (SBR), polybutadiene (BR), butadiene/acrylonitrile copolymers (NBR), acrylic polymers, polychloroprene, polyisoprenes, this list not being limiting.

The polymer-based mixture suitable for imparting suitability for graining may be constituted by certain nitro-cellulose polymers, polyurethanes, acrylic polymers, or vinyl polymers.

Polymers suitable for constituting the insulation in Examples 5 and 6 may be thermoplastic polymers based on PVC, polyurethanes, and natural or synthetic elastomers. Particular mention may be made of using a plasticized PVC or "plastisol" which contains plasticizing agents, e.g. esters of phthalic acid, of odipic acid, of sebacic acid, or of phosphoric acid. It is also possible to use polyurethane elastomers. It is also possible to mix an emulsion of PVC with other dispersions of butadiene/acrylonitrile copolymers or butadiene/acrylonitrile/styrene copolymers which act as plasticizing agents. Finally, it is possible for the polymer to contain swelling agents that operate by an exothermal process, for example, in particular when the polymer is deposited by printing or coating and includes PVC, for example. As swelling agent, particular mention can be made of products such as Génitron® based on azodicarbonamide or on sulfohydrazide, which after decomposing at high temperature gives off gas such as carbon monoxide or hydrogen, carbon dioxide or ammonia, thereby creating cells and causing the coating to swell. It is also possible to use water as the swelling agent when using insulation of the polyurethane type made form thylene disocyanate, polyester, and polyether.

In Examples 1 to 10, it is possible to replace the paper base with any other fiber base, and in particular a non-woven fabric.

Naturally, the invention is not limited to the embodiments described above. In particular, the invention also applies to making documents in which the multilayer structure including the chip is not assembled with a booklet, for example an identity card.

The cover may be subjected to decoration treatments, in particular a colored metallized film or a holographic film may be applied thereto by hot transfer and applying pressure, which film may be deposited on the cover prior to incorporating the set of pages or on the booklet after the pages have been put into place.

The cover may be printed by photogravure or by silkscreen printing so as to receive a pattern that is visible or invisible, constituting a security pattern or otherwise.

The chip may be integrated in the cover of a passport using methods other than those described above, depending on the structure of the radiofrequency identification device.

The cover may comprise a greater or smaller number of different layers.

The antenna may be made other than by silkscreen printing, for example by transferring a film covered in copper conductive tracks made by etching.

The invention is not limited to passports and also applies to other record books, bank passbooks, or the like.

In the figures, real relative thicknesses are not complied with in order to clarify the drawings.

What is claimed is:

1. A multilayer structure forming a cover paper for a passport, the multilayer structure being folded in accordance with a fold of the cover, the structure including a radio-frequency identification device having a chip, the materials constituting the various layers of the multilayer structure being selected, as the thickness of said layers, in such a manner that the cover withstands mechanical and thermal shocks, and is configured to be subjected to at least one of graining treatment by having a film deposited thereon by hot transfer under pressure, decoration treatment by having a film deposited thereon by hot transfer under pressure, and lamination treatment while depositing security films, the structure including at least one sheet having a fiber base, the chip being received, without leading to extra thickness, in the thickness of a first layer whose thickness is greater than the thickness of the chip so that said chip is protected from shocks both by the first layer and by a support layer, one face of which is covered by the first layer, the thickness of the first layer being sufficient to ensure that during a compression of said treatment, the thickness of the first layer is greater than that of the chip, the first layer presenting toughness enabling said layer, in the event of short-term compression, to conserve thickness greater than or equal to the thickness of the chip, the chip being received in the thickness of the multilayer structure without leading to extra thickness, the structure not presenting any localized extra thickness.

2. A multilayer structure according to claim 1, wherein the chip is situated close to the fold.

3. A multilayer structure according to claim 1, wherein the fiber base is a cellulosic blotting paper or one not woven fabric.

4. A multilayer structure according to claim 3, wherein the fiber base contains a polymer material chosen so as to confer on the multilayer structure properties of resisting tearing and properties of toughness that are sufficient to protect the radio-frequency identification device from mechanical shocks.

5. A multilayer structure according to claim 4, wherein the polymer material is selected from a group consisting of natural or synthetic rubbers; butadiene styrene rubber; polybutadiene; butadiene/acrylonitrile copolymers; acrylic polymers; polychloroprene; and mixtures thereof.

6. A multilayer structure according to claim 1, wherein the first layer contains a fiber base.

7. A multilayer structure according to claim 1, wherein the first layer comprises a polymer material selected so as to confer on the multilayer structure toughness properties that are sufficient to protect the radio-frequency identification device from mechanical shock.

8. A multilayer structure according to claim 1, containing a layer of a material on polymer base, capable of the graining, and chosen in the following list: polymers with PVC, with polyurethanes or with natural or synthetic elastomers, emulsions of PVC and copolymer butadiene/acrylonitrile or copolymer butadiene/acrylonitrile/styrene, and their mixtures.

9. A multilayer structure according to claim 1, wherein the device of the radio-frequency identification device comprises a silkscreen-printed antenna.

10. A booklet cover having the multilayer structure according to claim 1.

11. A booklet cover according to claim 10, a face of the support layer being covered by a second layer of a material capable of the graining, the outside surface of the cover presenting a grain.

12. A booklet cover according to claim 10, containing a colored or holographic metallic film applied by an operation of decoration.

13. A booklet cover according to claim 10, containing a printing by photogravure or by silkscreen printing of a visible or invisible pattern.

14. A passport comprising a cover as defined in claim 10, and a set of pages with an endpaper struck on the reverse of the front flap of the cover.

15. A passport according to claim 14, the endpaper being configured to receive printing of variable grades and to be covered by an adhesive transparent film.

16. A method of manufacturing a multilayer structure having a thickness, forming a cover paper for a passport, the multilayer structure being folded in accordance with a fold of the cover, the structure including radio-frequency identification device having a chip, the materials constituting the various layers of the multilayer structure being selected, as the thickness of said layers, in such a manner that the cover withstands mechanical and thermal shocks, and is configured to be subjected to at least one of a graining treatment by having a film deposited thereon by hot transfer under pressure, decoration treatment by having a film deposited thereon by hot transfer under pressure, and lamination treatment while depositing security films, the structure including at least one sheet having a fiber base, the chip being received, without leading to extra thickness, in the thickness of a first layer whose thickness is greater than the thickness of the chip so that said chip is protected from the shocks both by the first layer and by a support layer, one face of which is covered by the first layer, the thickness of the first layer being sufficient to ensure that during a compression of said treatment, the thickness of the first layer is greater than that of the chip, the first layer presenting toughness enabling said layer, in the event of short-term compression, to conserve thickness greater than or equal to the thickness of the chip, the chip being received in the thickness of the multilayer structure without leading to extra thickness, the structure not presenting any localized extra thickness, the method comprising:

placing the radio-frequency identification device on a first sheet;

and one of the following steps:
  a) assembling said first sheet on a second sheet in such a manner as to obtain a resultant thickness that is substantially constant, the second sheet being sufficiently compressible at the time of assembly to receive the chip in its thickness, or
  b) laminating said first sheet with a second sheet, the chip of the radio-frequency identification device being situated on the inside of the first sheet, a hole or a cavity being formed in the second sheet, said cavity being of a shape configured to receive the chip, the chip being put into place in said hole or cavity while said first sheet and said second sheet are being laminated together, or
  c) making a second sheet with a hole or a cavity having a shape configured to contain the chip;
  making a third sheet; and
  laminating together the first sheet, the second sheet and the third sheet so that the second sheet is sandwiched between the first sheet and the third sheet and so that the chip is received in the hole or cavity in the second sheet, or
  d) a coating having been made before the placing the radio-frequency identification device with a cavity of a shape configured to contain the chip on the first sheet and the radio-frequency identification device received in this cavity on the first sheet,
  coating the sheet on the side carrying the radio-frequency identification device so as to protect the device, or
  e) depositing a coating on the first sheet to a thickness greater than the thickness of the chip, for steps a) to e), the thickness of the second layer or of the coating being greater than the thickness of the chip and being sufficient to ensure that, during a compression of a treatment of at least one of graining and decoration by at least one of having a film deposited thereon by hot transfer under pressure and by rolling while depositing security film, the thickness is greater than the thickness of the chip, the first sheet containing a fiber base, said fiber base being saturated with a material configured to provide resistance to tearing and subsequently for protecting the radio-frequency identification device, the chip and an antenna of the radio-frequency identification device being deposited on a face of said first sheet once dry.

17. A method according to claim 16, wherein the step b) is performed and wherein the first sheet also comprises a cavity in which the chip is partially received.

18. A method according to claim 16, wherein the step b) is performed, wherein the second sheet is made with a hollow watermark of depth greater than the thickness of the chip, the chip being placed on the first sheet, and the second sheet and the first sheet being laminated together in such a manner that the chip is received in the watermark.

19. A method according to claim 16, wherein the step e) is performed, the radio-frequency identification device being deposited on one face of the sheet with the thickness deposited being greater than the thickness of the chip and said face of the sheet being coated in a mixture based of a non-gelled liquid resin.

20. A method according to claim 19, wherein the layer deposited by coating is grained after drying.

21. A method according to claim 16, wherein the step e) is performed and wherein a resin based on a hot-melt component is deposited on the face of the sheet carrying the radio-frequency identification device, the resin being deposited to a thickness greater than the thickness of the chip.

22. A method according to claim 21, wherein the coating is marked while hot so as to create graining.

23. A method according to claim 16, wherein the first sheet is coated with polymer-based mixture that is suitable for graining.

24. A method according to claim 16, wherein the step in which the radio-frequency identification device is placed on the first sheet comprises making the antenna other than by silkscreen printing.

* * * * *